United States Patent [19]
Desousa et al.

[11] Patent Number: 6,160,717
[45] Date of Patent: Dec. 12, 2000

[54] INTEGRATED RETENTION SPRING WITH CARD EJECTOR

[75] Inventors: Carl Desousa, San Jose; Robert Goyette, Santa Clara, both of Calif.

[73] Assignee: Cisco Technology Inc., San Jose, Calif.

[21] Appl. No.: 09/256,900

[22] Filed: Feb. 24, 1999

[51] Int. Cl.[7] .................................................. H05K 7/14
[52] U.S. Cl. ..................... 361/798; 361/754; 361/756; 361/759; 361/801
[58] Field of Search .................................. 361/725–727, 361/754, 756, 759, 787, 798, 801, 802

[56] References Cited

U.S. PATENT DOCUMENTS

| | | | |
|---|---|---|---|
| 4,628,413 | 12/1986 | Speraw | 361/801 |
| 5,275,573 | 1/1994 | McCleerey | 439/159 |
| 5,309,325 | 5/1994 | Dreber et al. | 361/754 |
| 5,383,789 | 1/1995 | Watanabe | 439/159 |
| 5,443,395 | 8/1995 | Wang | 439/159 |
| 5,504,656 | 4/1996 | Joist | 361/754 |
| 5,536,180 | 7/1996 | Ishida et al. | 439/159 |
| 5,669,512 | 9/1997 | Joslin | 211/41 |
| 5,692,208 | 11/1997 | Felcman et al. | 395/800 |
| 5,801,926 | 9/1998 | Cutsforth et al. | 361/754 |

*Primary Examiner*—Jeffrey Gaffin
*Assistant Examiner*—Tuan Dinh
*Attorney, Agent, or Firm*—Sheridan Ross P.C.

[57] ABSTRACT

An ejector for a printed circuit board overcomeably retains the ejector, e.g. in open and/or closed positions. Preferably a spring for providing a retaining force is integrally formed as part of the ejector body. When the ejector body is formed by injection molding, an injection gate is located to provide laminar flow of injection material through the spring area.

19 Claims, 3 Drawing Sheets

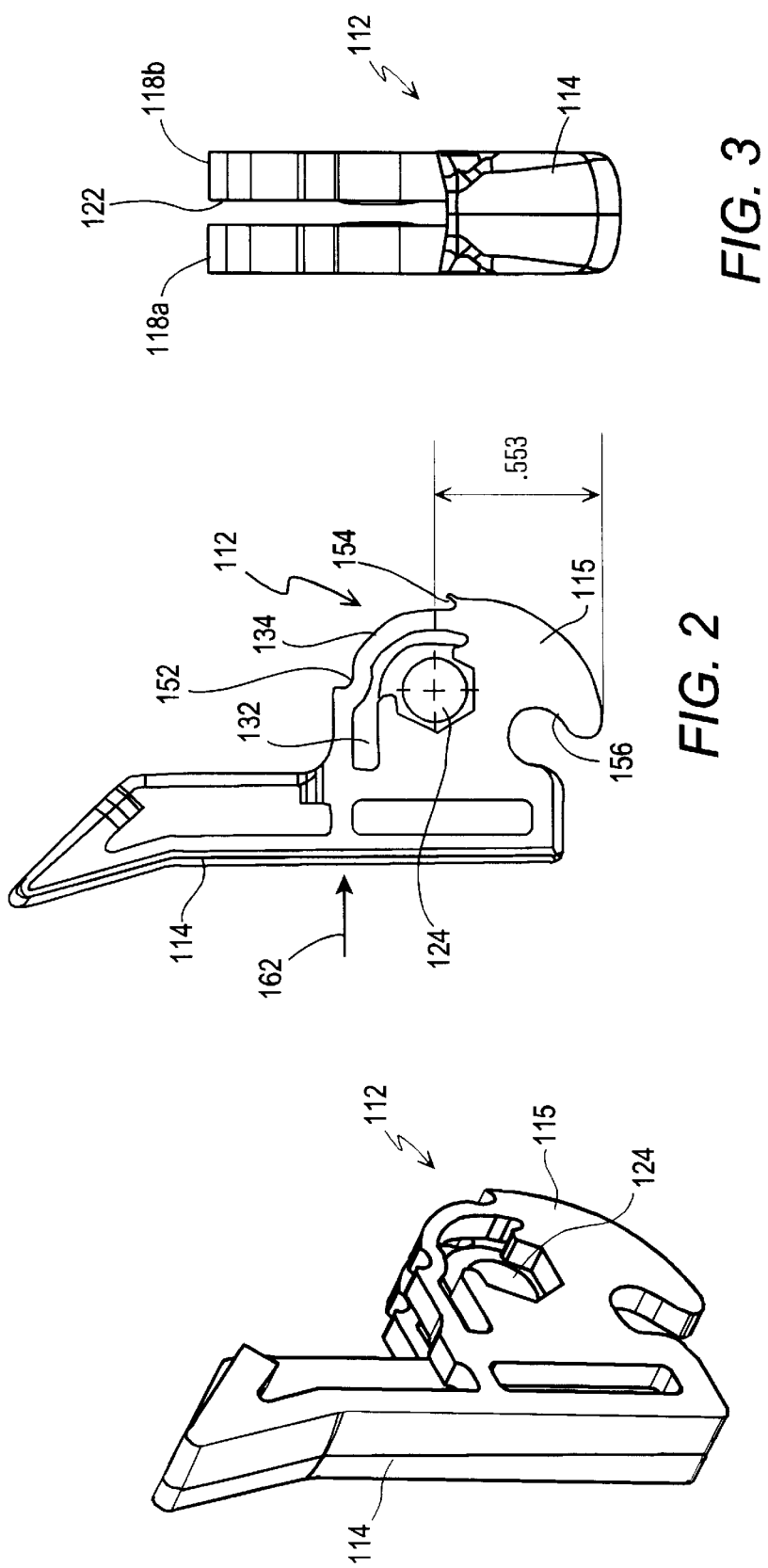

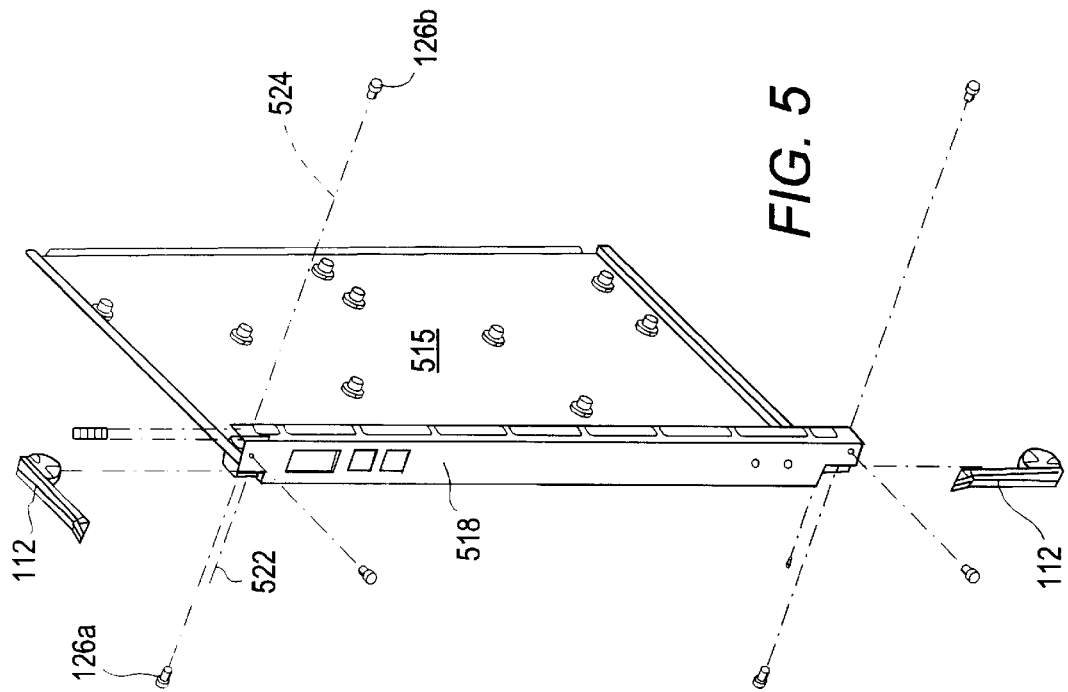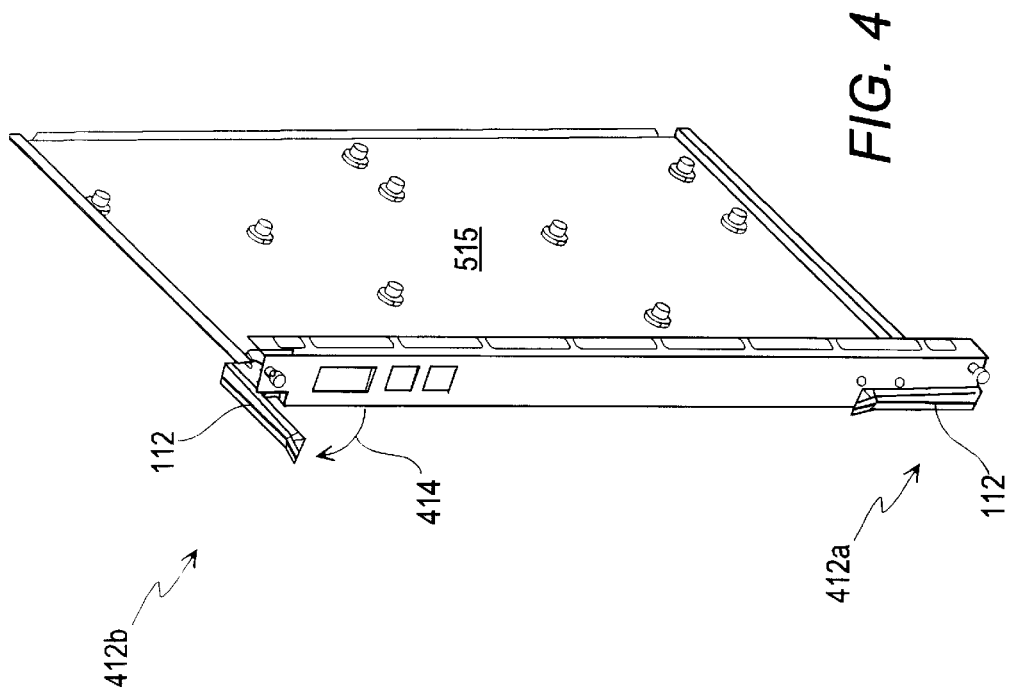

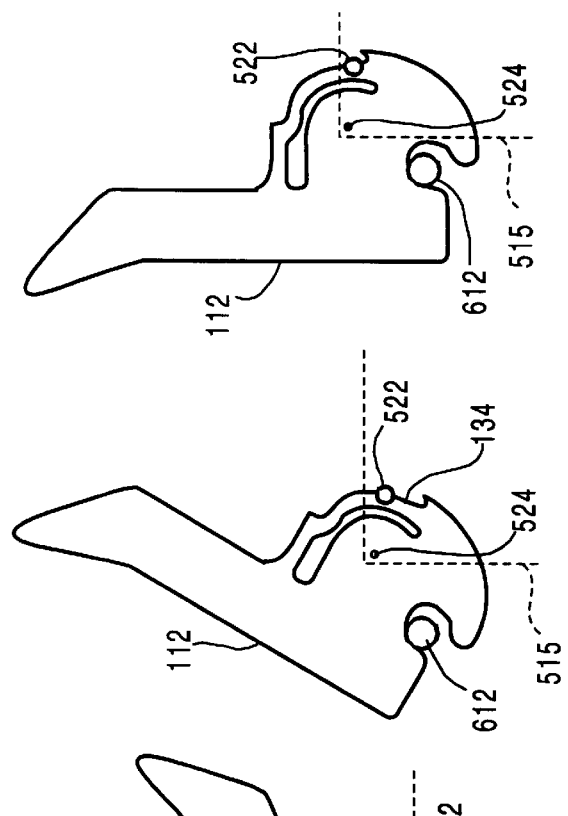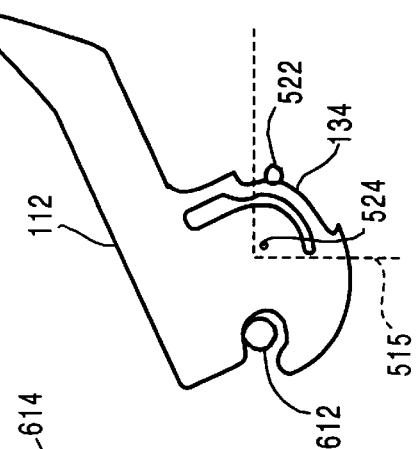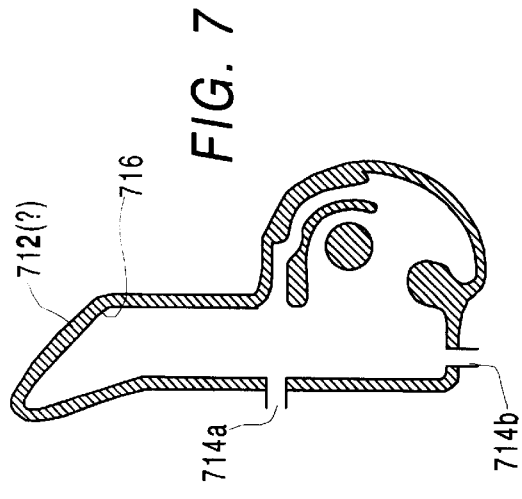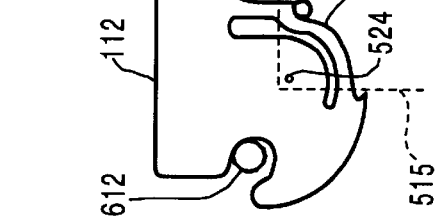

INTEGRATED RETENTION SPRING WITH CARD EJECTOR

The present invention relates to a card ejector for use in inserting and removing printed circuit boards in particular to a card ejector with an integral spring for holding the ejector in predetermined positions.

BACKGROUND INFORMATION

Many printed circuit boards or "cards" are provided with a card ejector, typically coupled either directly to the card or to a printed circuit board (PCB) carrier for use in removal or insertion of the cards in the chassis or box of an electronic device. Typically, card ejectors are positioned adjacent two proximal corners of a PCB or PCB carrier and are rotatable through an angle, typically 90 degrees, by lifting or pushing a tab portion of the ejector. A portion of the ejector perimeter typically includes a hooked recess for engagement with a post or pin which is located in a fixed position with respect to the chassis. In typical use, when the card is fully inserted and in place in the electronic device, the chassis post or pin is positioned within the ejector recess. When it is desired to remove the card, the tabs of the two card ejectors are substantially simultaneously rotated about 90 degrees causing the ejector to impart a upward ejecting force on the card (or card carrier) as the edges of the ejector recess bear against the chassis posts. The card ejectors are configured such that the ejection motion resulting from rotation of the card ejector suffices to substantially disengage the card from the holder or socket with which it is engaged, permitting complete manual withdrawal of the card, with relatively small force requirement.

In the usual situation, it is desirable to be able to retain the card ejector either in its fully closed position (i.e. the position of the ejector when the card is fully inserted into the chassis) or the fully opened position (typically with the tab rotated 90 degrees from the fully closed position of the tab), i.e. to restrain the ejector from free rotation when the ejector is in the fully closed or fully opened position. Some card ejector devices have been provided which include a separate position-retaining mechanism or device, such as a spring-loading or spring-locking device for loading or locking the ejector in the fully opened or fully closed position (or both). Such mechanisms, while operable for certain situations, can present some undesirable features, such as the need to provide multiple parts (e.g. springs or other urging parts, separate from the ejector body) the need for mounting multiple different parts with respect to one another and/or the PCB (or PC carrier) the need for assuring proper alignment of the various different parts during assembly, and the like. As with many systems having multiple parts, such multiple part ejector retention system tends to create undesirably high costs of designing, fabricating, maintaining, and the like. Accordingly, it would be useful to provide a card ejector which can retain the ejector in at least fully open and fully closed position while reducing or eliminating the need for multiple different components or parts for the ejector system or otherwise simplifying the design fabrication and/or use of the ejector.

SUMMARY OF THE INVENTION

The present invention provides for a card ejector in which a spring or other urging device for retaining the ejector in a fully open or fully closed position is substantially integrated with (made as a single part with) the rotatable ejector body. Preferably the entire card ejector system (exclusive of the rotation pin and chassis post or pin) can be formed from two parts, namely the rotatable ejector body, and a roll pin, as described below. According to one aspect of the invention, the ejector body is formed with a slot defining a web which acts as a spring. The configuration and position of the spring and the ejector rotation axis, with respect to the roll pin, are such that, in the closed position, the roll pin is received in a detent of the ejector body, with the urging of the spring tending to restrain the ejector against rotation, while, when the ejector is in the fully open position, the roll pin is pressed against the urging of the spring to provide an interference or friction engagement with the roll pin, tending to avoid movement of the ejector away from the fully open position.

In one embodiment, the ejector body is formed from a thermoplastic material by an injection molding system with gating configured to provide laminar flow of the thermoplastic material through the spring region.

BRIEF DESCRIPTION OF THE DRAWINGS

FIG. 1 is a perspective view of a ejector body according to an embodiment of the present invention;

FIG. 2 is a side elevational view of the ejector of FIG. 1;

FIG. 3 is an end elevational view of the ejector of FIG. 1;

FIG. 4 is a perspective view of a PCB and PCB carrier with first and second card ejectors according to an embodiment of the present invention;

FIG. 5 is an exploded view corresponding to FIG. 4;

FIGS. 6A–6D are side elevational views of an ejector and roll pins at successive stages of ejector rotation during card ejection according to an embodiment of the present invention; and FIG. 7 is a longitudinal cross section through an injection mold according to an embodiment of the present invention.

DETAILED DESCRIPTION

As depicted in FIG. 1–3, in one embodiment, an ejector body 112 includes a tab or handle portion 114 and a root portion 115 formed of two parallel plates 118a, 118b defining a space 122 therebetween for receiving a portion of a printed circuit board or carrier. The ejector root 115 defines a hook recess 156 for engaging a chassis post or pin 612 (FIGS. 6A–6D). An opening 124 is formed through the root portion 115 for receiving a coupler, such as a nut and bolt 126a, 126b, preferably including an integrated bushing portion, for rotatably coupling the ejector 112 to a printed circuit board 515 or carrier 518, to define a ejector rotation axis 524. The rotatable nature of the coupling permits the ejector 112 to be rotated 414 between a first, closed position 412a (FIG. 4) with the tab 114 substantially parallel to an axis (such as the long axis) of the PCB 515 and a second, fully opened, position 412b with the tab 114 about 90 degrees from the closed tab position.

As best seen in FIG. 2, each plate 118a,b of the root 115 is formed with an elongate slot 132 defining a web or spring portion 134. The web or spring portion 134 has a relatively small or narrow extent such that it can flex, e.g. inwardly, but has sufficient resiliency that, in response to such inward flexing, an outward spring force or urging force is developed. Preferably, the entire ejector body 112 is formed in a single formation process such as a single injection molding step so that the spring 134 is integrally formed with (formed in substantially the same operation as) the remainder of the ejector body 112. As seen in FIG. 2, a recess or detent 152 is formed near one end of the web 134. As described more thoroughly below, the detent 152 is configured to engage a roll pin 522 position on the PCB or PCB carrier for retaining the ejector 112 in the closed position 412a. A shoulder 154 is formed near the opposite extreme of the web 134 for engaging the roll pin 522 to act as a stop when the ejector body 112 is moved 414 to the fully opened position 412b. The exterior profile of the web 134 between the detent 152 and the shoulder 154, as shown in FIG. 2, is roughly (but not necessarily precisely) a circular section, such as a quarter-circular section.

In one embodiment, the ejector body is formed by an injection molding process in which a thermoplastic injection material is injected, through one or more gates 714a,b (FIG. 7), into the cavity 716 of a mold 712. In one embodiment, a 30% glass fill polycarbonate injection material is used. To assist in forming an ejector body 112 with a web 134 having the desired strength, flexibility, resiliency and similar properties, it is preferred to design an injection molding system and apparatus to provide for substantially laminar flow of injection material to at least the majority of and, preferably substantially all of, the web portion 134. In one embodiment, this is facilitated by including a gate 714a in the injection molding system at a position 162 substantially aligned with the end of the web 134 where the web joins the tab portion 114.

As depicted in FIG. 6A, when the ejector 112 is in the closed position, and the card is fully inserted in a suitable chassis, the hook recess substantially engages the chassis post 612 and the detent 152 engages the roll pin 522 (which is positioned in a fixed location with respect to the PCB card 515. Because of the resilient spring-like nature of the web 134, movement of the ejector 112 away from the closed position is (overcomeably) resisted by the engagement of the detent 152 and roll pin 522, since movement of the ejector 112 (such as rotation about the axis 524) will require inward flexing of the web 134, against the urging or resilient nature of the web or spring 134. Thus, the engagement of the detent 152 and roll pin 522, by virtue of the urging of the web or spring 134 assists in maintaining the printed circuit board 515 in the fully inserted position and guards against inadvertent disengagement.

However, when it is intended to disengage the printed circuit board 515 (or to "eject" the "card") the user may pull upward 614 on the free end of the tab 114 with sufficient force to overcome the urging of the spring 134 and rotate the ejector 112 about the rotation axis 124 e.g. toward the position shown in FIG. 6B, flexing the web or spring 134 inwardly (towards the slot 132). As shown in FIG. 6B, this action rotates the ejector 112 to a position with the roll pin contacting the web 134 but spaced from the detent 152. The ejector, being still engaged with the (fixed) chassis pin 612, by rotating (with respect to the PCB 515) about the rotation axis 524, causes the rotation axis 524 to rise, with respect to the chassis pin 612, thus carrying the PCB 515 upward as shown in FIG. 6B. Continued rotation of the ejector body to the position shown in FIG. 6C, and thence to the stop location shown in FIG. 6D raises the printed circuit board 515 sufficiently to disengage it to the point that it can be manually removed with little force.

Preferably, the outer surface of the web 134 is shaped in such a fashion that, at the fully opened position depicted in FIG. 6D, the roll pin 522 is in substantial interference fit with the outer surface of the web 134 (adjacent the shoulder 154), flexing the web or spring 134 inwardly (towards the slot 132). The compressive, friction (or interference) force between the roll pin 522 and the outer surface of the web 134 is sufficient to (overcomeably) retain the ejector 112 in the fully opened position shown in FIG. 6D. In one embodiment, the outer surface of the web 134 is configured such that the interference engagement between the outer surface of the web 134 and the roll pin 522 substantially continuously increases throughout rotation of the ejector body 112 from a position after the roll pin is engaged with the detent (FIG. 6B) to the open position (FIG. 6D). In one embodiment, the maximum interference fit, obtained in the open position FIG. 6D provides an interference with a magnitude (compared to the position of the unflexed spring) of about 0.02 inches (about 0.5 mm).

In light of the above description a number of advantages of the present invention could be seen. The present invention provides for a card ejector which can be (overcomeably) retained at selected positions such as fully opened and fully closed positions, while reducing the number of components or parts used for achieving such retention at selected positions. In one embodiment, a spring member employed in retaining the ejector at selected positions is integrally formed in the same step as the remainder of the ejector body, such as by an injection molding process. The present invention provides for card ejectors which can be retained in selected positions e.g. for achieving security and ease of use, while providing relatively low costs of material and fabrication.

A number of modifications and variations of the invention can be used. It is possible to provide some features of the invention without providing others. For example, it would be possible to configure an ejector which uses an integral spring for retaining the ejector in the open position without using the spring for retaining the ejector in a closed position. Although it is preferred to provide the spring or web portion as a single web separated by a continuous slot, both having roughly a quarter circle shape, it is possible to provide a longer or shorter slot, or a series of slots, or to provide other shapes such as elliptical, oval or polygonal webs or slots. Although a polycarbonate injection material is preferred, it is possible to form a ejector according to embodiments of the present invention using other materials including fiberglass, resins, other thermoplastic materials and the like. Although injection molding is a preferred fabrication process, there is no theoretical reason why an operable ejector according to the present invention could not be formed using other processes such as machining, casting, stamping and the like.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Card ejector apparatus comprising:

an ejector body, coupled to one of a a printed circuit board and a printed circuit board carrier to permit rotation of said ejector body with respect to said one of said printed circuit board and said printed circuit board carrier about a rotation axis, said ejector body having at least a first recess for engaging a chassis post;

a said ejector body defining a first arcuate slot which defines a web portion of said ejector body positioned outwardly of said slot, said web portion having first and second ends, said web portion being substantially resilient to accommodate flexing said web towards said slot, said web portion having an outer surface defining a first profile when said web is in a relaxed position; and a roll pin positioned at a fixed location with respect to said one of said printed circuit board and said printed circuit board carrier, said fixed position located to provide an interference engagement between said roll pin and said first end of said web when said rotatable card ejector is rotated to a first open position, said interference engagement being sufficient to resist rotation of said ejector away from said open position.

2. Apparatus as claimed in claim 1 wherein said profile defines a first distance between said rotation axis and a point on said web outer surface adjacent said first end of said web, said first distance being greater than a closest distance of a surface of said roll pin from said rotation axis.

3. Apparatus as claimed in claim 1, wherein said profile defines a distance of said web at said first end of said web, with respect to said rotation axis, which is greater than a distance of at least one other location on said web, from said rotation axis.

4. Apparatus as claimed in claim 1, wherein said profile defines a detent configured to engage said roll pin when said ejector is in a second closed position.

5. Apparatus as claimed in claim 4, wherein movement of said ejector from said closed position to said open position comprises rotation of said ejector body through about 90 degrees.

6. Ejector apparatus for ejecting a component which is one of a circuit board and a circuit board carrier, comprising:

an ejector body, coupled to said component to permit rotation of said ejector body with respect to said component about a rotation axis, said ejector body having at least a first recess for engaging a chassis post;

said ejector body defining a first arcuate slot;

spring means, integrally formed as a single piece with said ejector body, for resisting rotation of said ejector away from said open position, said spring means positioned outwardly of said slot, said spring means having first and second ends, said spring means being substantially resilient to accommodate flexing said spring means towards said slot, said spring means having an outer surface defining a first profile when said spring means is in a relaxed position; and engagement means, positioned at a fixed location with respect to said component, said fixed position located to provide an interference engagement between said engagement means and said first end of said spring means when said rotatable card ejector is rotated to a first open position, said interference engagement being sufficient to resist rotation of said ejector away from said open position.

7. Apparatus as claimed in claim 6 wherein said profile defines a first distance between said rotation axis and a point on said spring means outer surface adjacent said first end of said spring means, said first distance being greater than a closest distance of a surface of said engagement means from said rotation axis.

8. Apparatus as claimed in claim 6, wherein said profile defines a distance of said spring means at said first end of said spring means, with respect to said rotation axis, which is greater than a distance of at least one other location on said spring means, from said rotation axis.

9. Apparatus as claimed in claim 6, wherein said profile defines detent means configured to engage said engagement means when said ejector is in a second closed position.

10. Apparatus as claimed in claim 9, wherein movement of said ejector from said closed position to said open position comprises rotation of said ejector body through about 90 degrees.

11. A method for ejecting a component which is one of a circuit board and a circuit board carrier, with respect to a chassis, the method comprising:

coupling an ejector body to the component to permit rotation of said ejector body with respect to said component about a rotation axis, said ejector body having at least a first recess for engaging a chassis post, said ejector body defining a first arcuate slot which defines a web portion of said ejector body positioned outwardly of said slot, said web portion having first and second ends, said web portion being substantially resilient to accommodate flexing said web towards said slot, said web portion having an outer surface defining a first profile when said web is in a relaxed position;

positioning a roll pin at a fixed location with respect to said component, said fixed position located to provide an interference engagement between said roll pin and said first end of said web when said rotatable card ejector is rotated to a first open position, said interference engagement being sufficient to resist rotation of said ejector away from said open position; and rotating said ejector body about said rotation axis from a closed position, with said recess engaging said chassis post, to said open position.

12. A method as claimed in claim 11 wherein said profile defines a first distance between said rotation axis and a point on said web outer surface adjacent said first end of said web, said first distance being greater than a closest distance of a surface of said roll pin from said rotation axis.

13. A method as claimed in claim 11, wherein said profile defines a distance of said web at said first end of said web, with respect to said rotation axis, which is greater than a distance of at least one other location on said web, from said rotation axis.

14. A method as claimed in claim 11, further comprising engaging said roll pin with a detent defined in said second end of said web portion, when said ejector is in said closed position.

15. A method as claimed in claim 14, wherein said step of rotating comprises rotation of said ejector body through about 90 degrees.

16. A method for fabrication of a card ejector body defining at least a first web and a first slot, said ejector body also including a tab portion substantially adjacent a first end of said web, the method comprising:

providing an injection mold;

positioning at least a first injection gate at a location substantially aligned with said first end of said web; and injecting thermoplastic material into said mold at least through said first gate.

17. A method, as claimed in claim 16, wherein in said step of injecting comprises providing substantially laminar flow through a portion of said mold defining said web.

18. A method as claimed in claim 16, wherein said step of injection comprises injecting an injection material including polycarbonate.

19. A method as claimed in claim 16 wherein said step of injection comprises injecting polycarbonate which is about 30% glass filled.

* * * * *